United States Patent [19]

Ong et al.

[11] Patent Number: 5,233,562
[45] Date of Patent: Aug. 3, 1993

[54] METHODS OF REPAIRING FIELD-EFFECT MEMORY CELLS IN AN ELECTRICALLY ERASABLE AND ELECTRICALLY PROGRAMMABLE MEMORY DEVICE

[75] Inventors: Tong-Chern Ong, San Jose, Calif.; Ho-Chun Liou, Hsin Chu, Taiwan; Gregory E. Atwood, San Jose, Calif.

[73] Assignee: Intel Corporation, Santa Clara, Calif.

[21] Appl. No.: 815,945

[22] Filed: Dec. 30, 1991

[51] Int. Cl.⁵ .............................................. G11C 11/40
[52] U.S. Cl. .................................. 365/218; 365/185; 365/201
[58] Field of Search ............... 365/218, 185, 200, 201; 357/23.5

[56] References Cited

U.S. PATENT DOCUMENTS

| | | | |
|---|---|---|---|
| 4,672,581 | 6/1987 | Waller | 365/200 |
| 4,797,856 | 1/1989 | Lee et al. | 365/185 |
| 5,077,691 | 12/1991 | Haddad et al. | 365/218 |
| 5,097,444 | 3/1992 | Fong | 365/185 |
| 5,122,985 | 6/1992 | Santin | 365/185 |
| 5,132,935 | 7/1992 | Ashmore, Jr. | 365/185 |
| 5,146,429 | 9/1992 | Kawai et al. | 365/200 |

FOREIGN PATENT DOCUMENTS 0225700 10/1991 Japan .................................. 365/218

OTHER PUBLICATIONS

Yamada, et al., "A Self-Convergence Erasing Scheme for a Simple Stacked Gate EEPROM"; *IEDM*; pp. 307-310 (1991).

*Primary Examiner*—Eugene R. LaRoche
*Assistant Examiner*—Son Dinh
*Attorney, Agent, or Firm*—Blakely, Sokoloff, Taylor, & Zafman

[57] ABSTRACT

A method of reprogramming field-effect memory cells of a memory array of an electrically erasable flash memory device is described. Each cell has a drain, a source, and a control gate. The drains of the cells are electrically connected to a bit line of the memory array. The cells are programmed and erased. The cells are repaired by grounding the sources and the control gates and taking the bit line to a predetermined potential. The memory array is selectively programmed. Other embodiments include repairing field-effect memory cells connected to a source line or part of a word line. Verification may be done between the repair step and selectively programming step.

15 Claims, 5 Drawing Sheets

METHODS OF REPAIRING FIELD-EFFECT MEMORY CELLS IN AN ELECTRICALLY ERASABLE AND ELECTRICALLY PROGRAMMABLE MEMORY DEVICE

FIELD OF THE INVENTION

The present invention relates generally to the field of semiconductor devices, and specifically to repairing over-erased cells in an electrically erasable and electrically programmable memory device.

BACKGROUND OF THE INVENTION

One type of prior non-volatile semiconductor memory device is a flash electrically erasable and electrically programmable read-only memory ("EEPROM"). The flash EEPROM includes a memory array of field-effect memory cells. By flash, it is meant that the memory array may be erased in its entirety or section by section. A field-effect memory cell typically includes a source, a drain, a floating gate, and a control gate. The cell is typically a programmed cell or an erased cell. The programmed cell has a floating gate that is typically charged with electrons. The erased cell has a floating gate that typically has relatively fewer electrons compared to a programmed cell. A reprogramming sequence may include the following steps: 1) programming the cells by accumulating electrons within their floating gates regardless of whether or not each cell has been previously programmed, 2) erasing the cells by removing the electrons from their floating gates, and 3) selectively programming the memory array. After reprogramming, each erased cell should have a drain current greater than about 10 $\mu$A, and each programmed cell should have a drain current less than about 0.2 nA when the control gate of each cell is biased at about the power supply voltage and the drain of each cell is biased at about 1.0 V.

Within this application, a cell typically has two types of threshold voltages. The floating gate threshold voltage (VTFG) is the floating gate potential that gives a drain current of about 10 $\mu$A when the source is grounded and the drain is at a potential of about 1 V. One may choose a different drain current limit or drain potential for determining VTFG. The floating gate potential cannot be directly measured because the floating gate is electrically floating. The control gate typically induces a potential increase on the floating gate due to capacitive coupling. The control gate threshold voltage (VTCG) is the control gate potential that gives a drain current of about 10 $\mu$A when the source is grounded and the drain is at a potential of about 1 V. One may choose a different drain current limit or drain potential for determining VTCG. VTCG is typically higher than VTFG because the control gate coupling ratio typically is less than one.

FIG. 1 is a graph illustrating a typical VTCG distribution of memory cells in a memory array after the cells are erased. The x-axis is VTCG, and the y-axis is the cumulative fraction of cells having a VTCG equal to or lower than a given voltage. After erasing, many cells have a VTCG below 1.0 V and are called "tail cells" within this patent application. The number of tail cells is generally determined by the shape of the VTCG distribution curve. A tail cell may have a VTCG less than 0.0 V. Within the tail cell distribution, some of the tail cells are referred to as "over-erased cells" because their VTCG is below a predetermined potential, such as about 0.5 V, for example. One may set a different VTCG limit to determine whether or not a cell is an over-erased cell.

Problems may occur when an over-erased cell is present including a programming and read sensing problems and slower read access time. The problems are best described using specific examples. In the examples below, a flash EEPROM has a memory array including Cell 1 and Cell 2. The drains of both cells are electrically connected to a bit line, and the sources for both cells are grounded. Cell 1 has a VTFG after erase of 1.2 V, and Cell 2 is an over-erased cell having a VTFG after erase of 0.2 V. Both cells have a drain coupling ratio of 0.1 and a control gate coupling ratio of 0.5.

The memory array is to be reprogrammed so that Cell 1 becomes a programmed cell and Cell 2 becomes an erased cell. Both cells are programmed and erased. After the erase step, the memory array is selectively programmed. Cell 1 is programmed by taking Cell 1's control gate to a potential of about 12 V, and the bit line to a potential of about 6 V. Because of drain coupling and control gate coupling, the floating gate potential is about 6.6 V during selective programming. During selective programming, current typically flow through Cell 1 because the floating gate potential (about 6.6 V) is greater than its VTFG (1.2 V), and Cell 1 should program in about 10 $\mu$s. However, Cell 1 is influenced by over-erased Cell 2. Cell 2's source and Cell 2's control gate are typically grounded because Cell 2 is not being programmed. Cell 2's drain is at a potential of about 6 V due to the bit line. The floating gate of Cell 2 has a potential of about 0.6 V because of the drain coupling. Therefore, Cell 2 also has a significant drain current during programming because its VTFG (0.2 V) is less than its floating gate potential (0.6 V). This extra current reduces the bit line voltage slowing the selective programming of Cell 1.

The program sensing circuit typically cannot determine whether a bit line has a cell that is difficult to program or if the bit line has an over-erased cell. The selective programming continues until a program sensing circuit determines that Cell 1 is successfully programmed, continues for a predetermined number of cycles, such as 25 cycles of about 10 $\mu$S each, or continues for a predetermined amount of time, such as approximately 250 $\mu$S. If Cell 1 fails to program within the specified number of pulses or time, then the device is considered as failing programming.

Even if Cell 1 is reprogrammed, a problem may occur when Cell 1 is read. When a cell is read, its control gate typically is at about the power supply potential and its bit line typically is at a potential of about 1 V. A programmed cell should have a drain current less than about 0.2 nA, and an erased cell should have a drain current greater than about 10 $\mu$A. Even if Cell 1 is programmed (as determined by the program sensing circuit), the bit line may have a current between about 0.2 nA and about 10 $\mu$A because Cell 2 (an over-erased cell) is on the same bit line during reading. The read sensing circuit, which is different from the program sensing circuit, may incorrectly determine that Cell 1 is an erased cell. If the read sensing circuit incorrectly determines that a cell is erased when it is programmed, the device is non-functional.

Even if Cell 1 can be read, the read access time may be longer. If the drain current of Cell 1 is higher than about 0.2 nA, the read sensing circuit may need a longer time to determine whether the cell is programmed or erased. The read access time may be about 90 ns instead of about 80 ns. Slower read access times are not desired.

SUMMARY AND OBJECTS OF THE INVENTION

In view of the foregoing, one object of the present invention is to repair over-erased cells within a memory array before selectively programming the memory array.

Another object of the present invention is to reduce the number of devices that are rejected due to over-erased cell failing mechanisms.

Another object of the present invention is to repair a cell after an erase step of every reprogramming sequence.

A method of reprogramming field-effect memory cells of a memory array of an electrically erasable flash memory device is described. Each cell has a drain, a source, and a control gate. The drains of the cells are electrically connected to a bit line of the memory array. The cells are programmed and erased. The cells are repaired by grounding the sources and the control gates and taking the bit line to a predetermined potential. The memory array is selectively programmed.

Other embodiments include repairing field-effect memory cells connected to a source line or part of a word line. Verification may be done between the repair step and selectively programming step.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
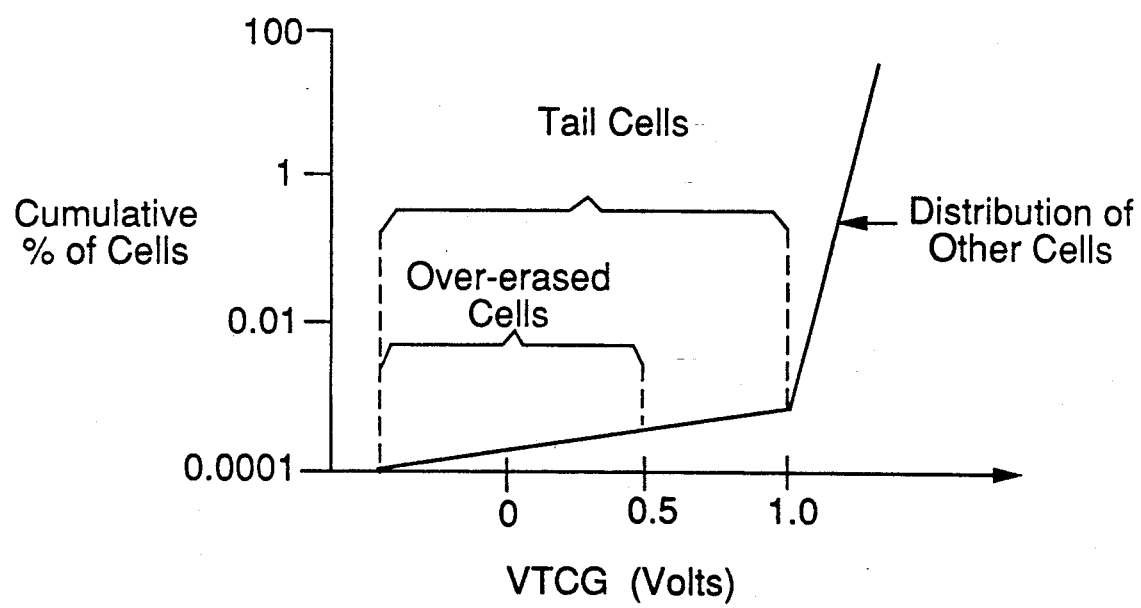
FIG. 1 includes an illustration of a control gate threshold voltage distribution of memory cells after erase (prior art).
Figure 2:
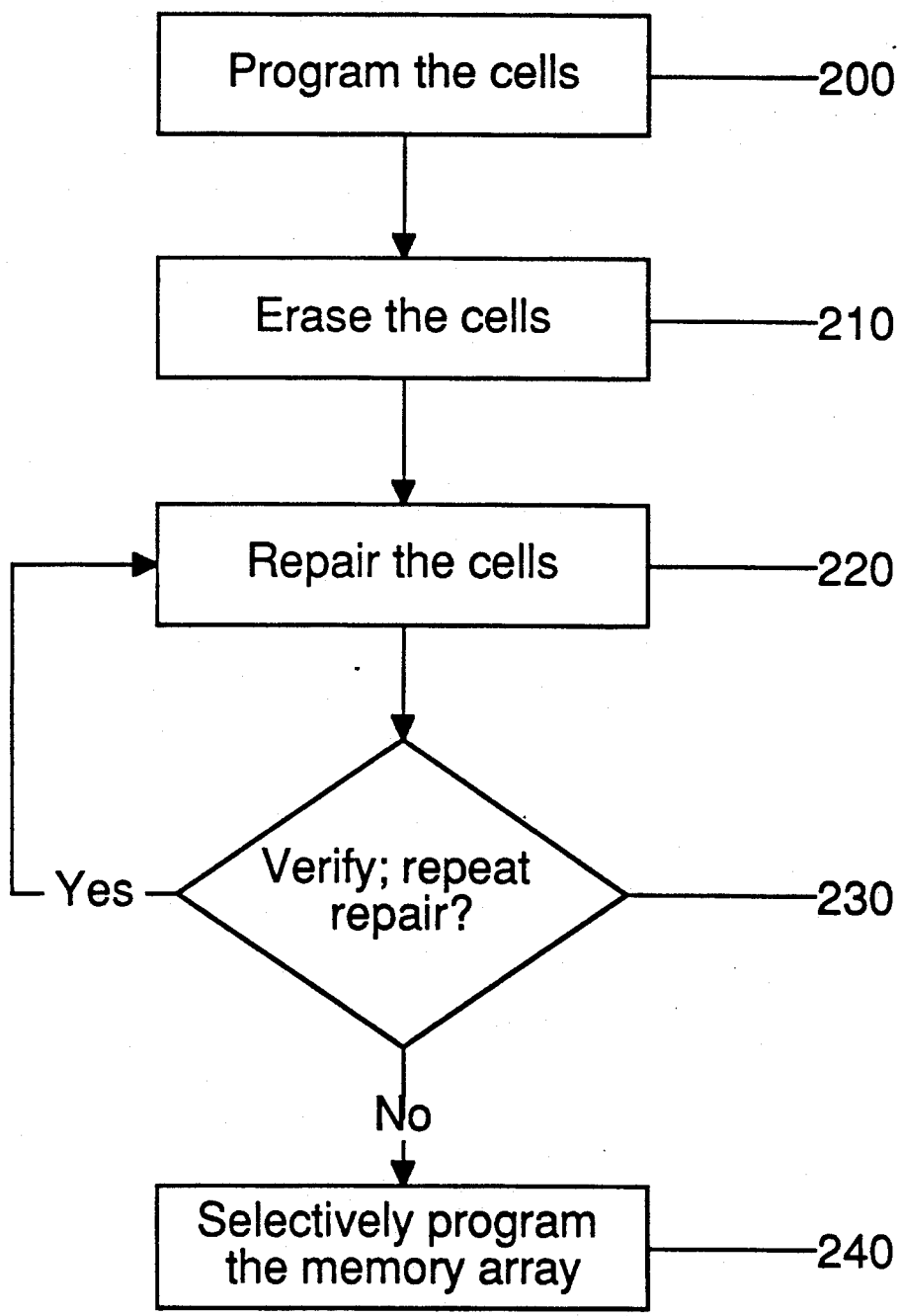
FIG. 2 includes an illustration of a flow chart of a reprogramming sequence for field-effect memory cells of a memory array of a flash EEPROM in accordance to one preferred embodiment.

FIG. 2 illustrates a flow diagram of a preferred embodiment of a reprogramming sequence for field-effect memory cells of a memory array of a flash EEPROM. Alternatively, one could use the reprogramming sequence on an electrically erasable and electrically programmable memory device that typically forms over-erased cells after an erasing step of the reprogramming sequence. In one preferred embodiment, each cell has a drain, a source, and a control gate. The drains of the cells are electrically connected to a bit line of the memory array. The reprogramming sequence includes the steps of programming the cells (step 200), erasing the cells (step 210), repairing the cells (step 220), verifying repair of the cells (step 230), and selectively programming the memory array (step 240). The first two steps of the reprogramming sequence are done using well known methods and typically form over-erased cells. Unlike the prior art reprogramming sequence, the over-erased cells are repaired (step 220) by accumulating electrons within the over-erased cells' floating gates during the repair step. The repair step helps to reduce the number of over-erased cells within a memory array as compared to the prior art method that does not repair over-erased cells. The repair of the cells is verified (step 230). If the verification criteria is not met, the repair step and verification step are repeated until the criterion is met. After the verification criterion has been met, the memory array is selectively programmed according to one's needs (step 240). The preferred embodiment helps to form a flash EEPROM having a more clearly defined binary distribution of drain currents between the memory cells of the memory array after selectively programming corresponding to one's desired data pattern.

Figure 3:
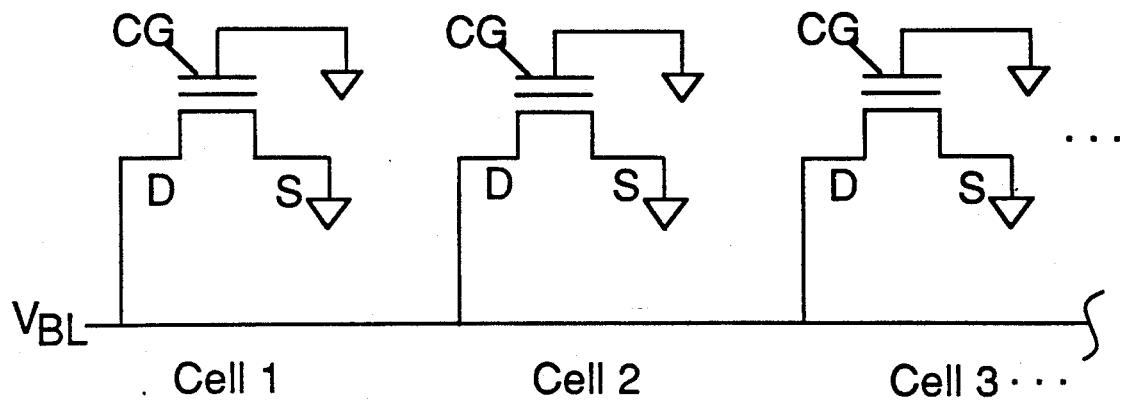
FIG. 3 includes an illustration of circuitry for repairing field-effect memory cells using drain disturb repair, wherein drains are electrically connected together in accordance with a preferred embodiment.
Figure 4:
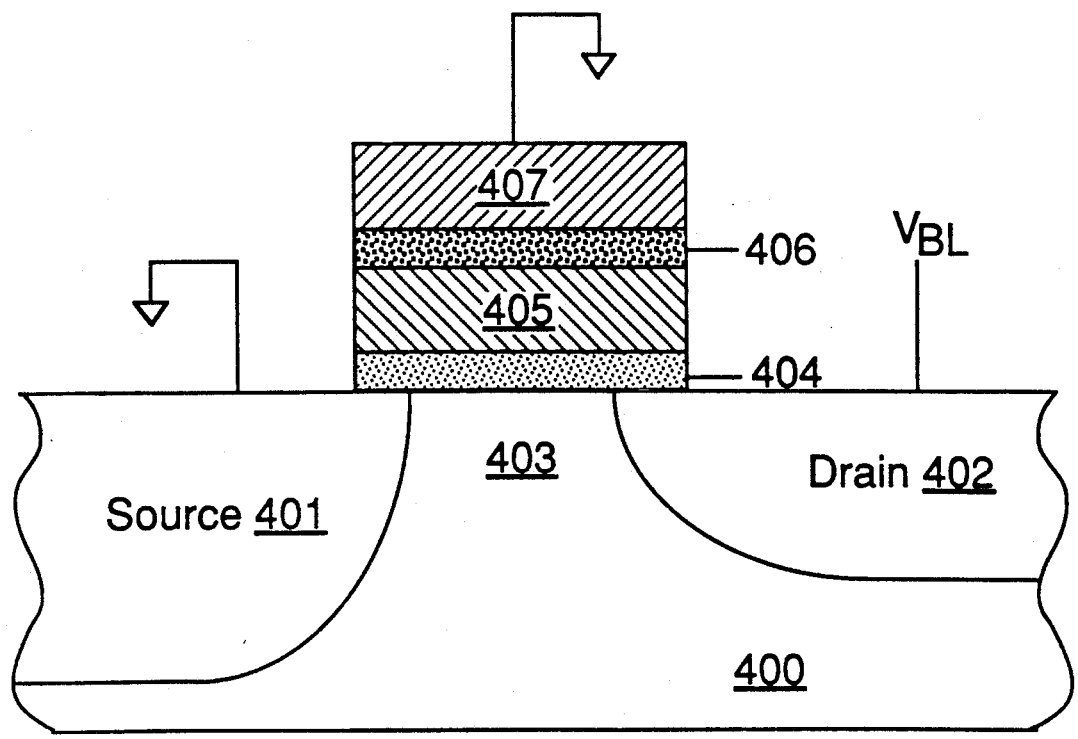
FIG. 4 includes an illustration of a cross sectional view of a cell connected to the bit line of FIG. 3 in accordance with a preferred embodiment.

FIG. 3 includes an illustration of a preferred embodiment used to repair field-effect memory cells of a flash EEPROM. Each memory cell has a drain, a source, and a control gate. The cells' drains are electrically connected to a bit line of the memory array. This preferred embodiment is called drain disturb repair. FIG. 3 illustrates the first three memory cells on the bit line. The rest of cells (not shown) are connected to the bit line similar to the first three cells shown in FIG. 3. FIG. 4 includes an illustration of one of the cells that appears in FIG. 3. The cell has a lightly p-type doped monocrystalline silicon layer 400. A source 401, which has a graded diffusion junction, and a drain 402 are heavily n-type doped regions within the monocrystalline silicon layer. A channel region 403 lies between the source 401 and the drain 402. A tunnel oxide 404, a floating gate 405, an integrate insulating layer 406, and a control gate 407 all lie over the channel region 403 and a portion of both the source 401 and the drain 402. The rest of the cells are substantially similar to the cell described.

The bit line cells are programmed by accumulating electrons within their floating gates and erased by removing electrons from the cells' floating gates. These two steps are well known in the art. Over-erased cells are typically formed during the erasing step. The over-erased cells are repaired. During drain disturb repair of the cells in FIG. 3, the sources and control gates are grounded, and the bit line is taken to a predetermined voltage $V_{BL}$ that is typically between about 6.0 V and about 7.0 V. $V_{BL}$ may range from about 3.5 V to about 10.0 V depending on the channel length and other cell parameters. $V_{BL}$ induces a potential on the floating gate of each cell electrically connected to the bit line due to the capacitive coupling between the drain and the floating gate. The increase of the floating gate potential during the repair step is the product of $V_{BL}$ and the drain coupling ratio. In an over-erased cell, VTCG is typically about 0.5 V or lower. The over-erased cell has a significant amount of drain current when the repair step starts because the floating gate potential due to drain coupling is typically higher than the cell's VTFG. The bit line current may be initially about 50 μA or more and is determined by VTFG of the over-erased cells and number of over-erased cells. Electrons move from the source and accelerate as they approach the drain due to $V_{BL}$ that produces an electric field near the drain. Some electrons within the channel region near the drain may have sufficient energy to cross the tunnel oxide into the floating gate. As electrons accumulate in the floating gate, the floating gate potential decreases causing the drain current of the over-erased cell to decrease. The accumulated electrons cause the cell's VTCG to increase. The repair procedure using this method typically lasts less than about a few tenths of a second, but depends on VTFG of the over-erased cells and the number of over-erased cells on the bit line.

In one preferred embodiment, the repair of the cells is verified after the repair step. The bit line current is monitored when the sources and control gates are grounded and the bit line is at a potential of about 1 V. If the bit line current is greater than about the product of the number of cells electrically connected to the bit line times 0.5 nA, the repair step and the verification step are repeated. In another preferred embodiment, the repair is verified by monitoring VTCG of each cell. In the VTCG embodiment, if VTCG for any cell electrically connected to the bit line is less than about 0.5 V, the repair step is repeated. In an alternate embodiment, the repair is verified by monitoring the source current of each cell electrically connected to the bit line. If the source current for any cell electrically connected to the bit line is greater than about 0.5 nA, the repair step and verification step are repeated. The repair and verification steps are completed after the verification criterion using any of the previously described embodiments is met.

In one preferred embodiment, the memory array is selectively programmed using well known methods. When a selectively programmed memory array is read, the control gates are biased at about the power supply voltage, the bit line is at about 1 V, and the sources are grounded. When read, a programmed cell typically has a drain current less than about 0.2 nA, and an erased cell typically has a drain current greater than about 10 μA. A preferred embodiment helps to form a memory array having a more clearly defined bimodal distribution of drain currents among the cells within the memory array.

The repair step changes VTCG of over-erased cells to minimize the number of over-erased cells. Using a preferred embodiment, a device is less likely to have programming and reading problems. The selectively programming step for a memory array is more likely to be faster because the drain current of a cell being programmed decreases faster. A preferred embodiment helps the cells to be read faster because a device typically has a more clearly binary distribution of drain currents within the memory array during reading.

In addition, the repair step typically helps to reduce the number of tail cells by increasing VTCG of the tail cells. During the repair step, a tail cell may have a VTFG near the floating gate potential, and the tail cell may have a significant drain current. The drain current during repair is typically less for a tail cell than for an over-erased cell. Electrons may accumulate within the floating gate of the tail cell that helps change the floating gate potential causing the tail cell's drain current to decrease in a manner similar to an over-erased cell. An "other" cell is a cell that is not an over-erased cell nor a tail cell. The other cell typically has a VTFG higher than the floating gate potential during the repair step. Therefore, the other cell has no significant drain current during the repair step and is less affected by the repair compared to an over-erased cell or a tail cell. The other cells are typically not adversely affected if the repair procedure is applied to it. Therefore, the repair procedure can be applied to any cell within a memory array.

Figure 5:
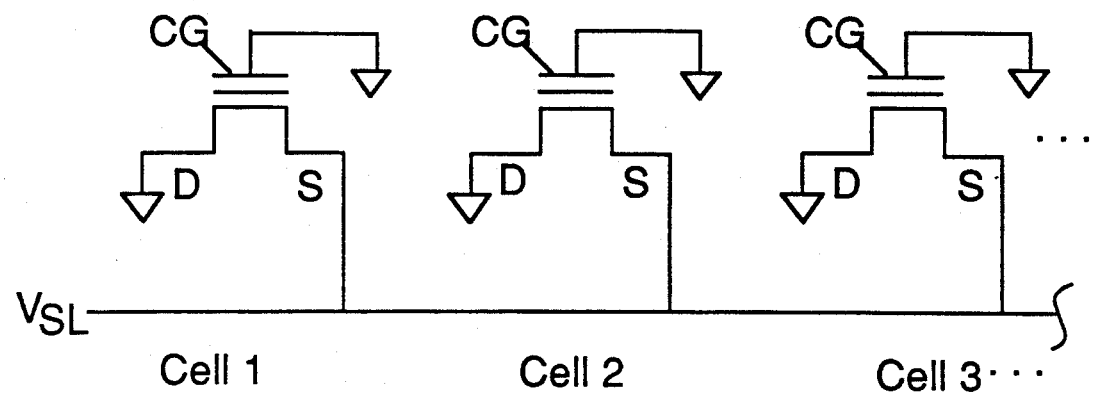
FIG. 5 includes an illustration of circuitry for repairing field-effect memory cells using source distrub repair, wherein sources of the cells are electrically connected together in accordance with an alternate embodiment.
Figure 6:
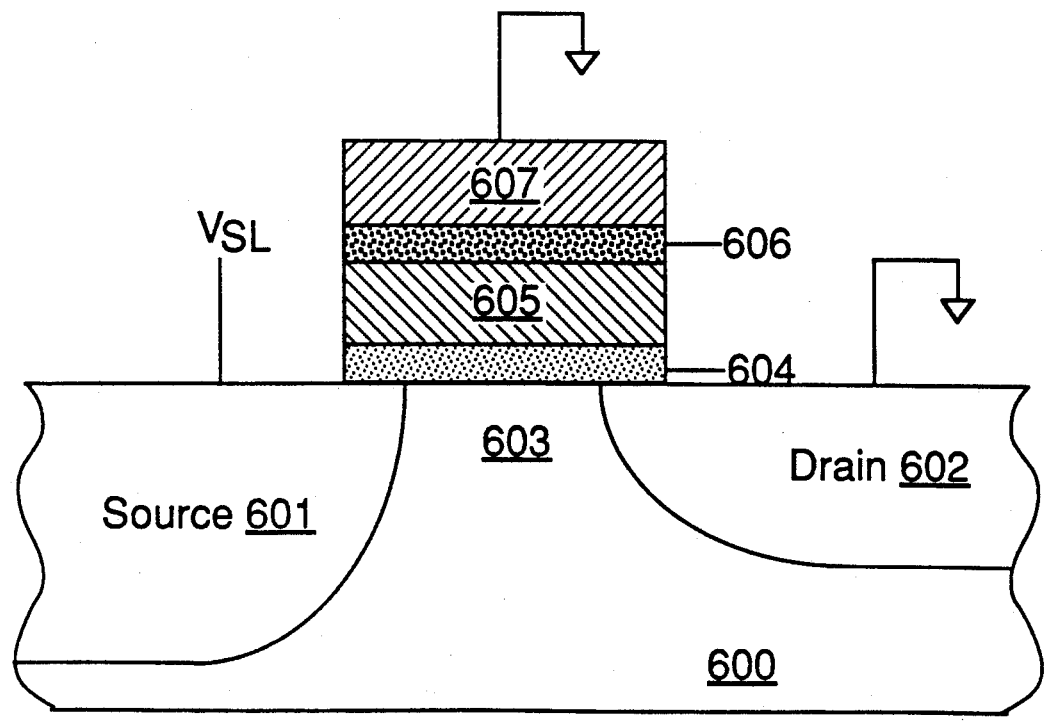
FIG. 6 includes an illustration of a cross sectional view of a cell connected to the source line of FIG. 5.

Many variations to a preferred embodiment may be made and still achieve significant benefits during a re-programming sequence. FIG. 5 includes an illustration of an alternate embodiment used to repair field-effect memory cells of a flash EEPROM. Each memory cell has a drain, a source, and a control gate. The sources of the cells are electrically connected to a "source line" of the memory array. As used in this patent application, a source line is similar to a bit line except that the sources, instead of the drains, are electrically connected together. This alternate embodiment is called source disturb repair. FIG. 5 illustrates the first three cells. The rest of the cells (not shown) are electrically connected to the source line similar to the first three cells shown in FIG. 5. FIG. 6 includes an illustration of one of the cells that appears in FIG. 5. The cell has a lightly p-type doped monocrystalline silicon layer 600. A source 601, which has a graded diffusion junction, and a drain 602 are heavily n-type doped regions within the monocrystalline silicon layer. A channel region 603 lies between the source 601 and the drain 602. A tunnel oxide 604, a floating gate 605, an intergate insulating layer 606, and a control gate 607 all lie over the channel region 603 and a portion of both the source 601 and the drain 602. The rest of the cells are substantially similar to the cell described.

The cells are programmed and erased using well known methods that typically form over-erased cells. The over-erased cells are repaired. During source disturb repair, the drains and control gates are grounded, and the source line is taken to a predetermined voltage $V_{SL}$ that is typically between about 6.0 V and about 7.0 V. $V_{SL}$ may range from about 3.5 V to about 10.0 V. This method is nearly the mirror image of the method used for the drain distrub repair. Electrons move from the drain to the source until enough electrons accumulate in an over-erased cell's floating gate. The source line current decreases as electrons accumulate in the over-erased cell's floating gate. The source disturb repair may be longer than the drain disturb repair because the source 601 has a graded diffusion junction that typically produces a smaller electric field compared to the electric field near the drain when using drain disturb repair.

The repair step is verified by monitoring the drain current, source line current, or VTCG. For drain current or source line current verification, the source line and the cells' control gates are grounded, and the cells' drains are at a potential of about 1 V. If the drain current for any cell electrically connected to the source line is greater than about 0.5 nA or if the source line current is greater than about the product of the number of cells electrically connected to the source line times 0.5 nA, the repair step and verification step are repeated. For VTCG verification, if VTCG of any cell electrically connected to the source line is lower than about 0.5 V, the repair step and verification step are repeated. The repair step and verification step are completed after the verification criterion is met. The memory array is selectively reprogrammed using well known methods.

Figure 7:
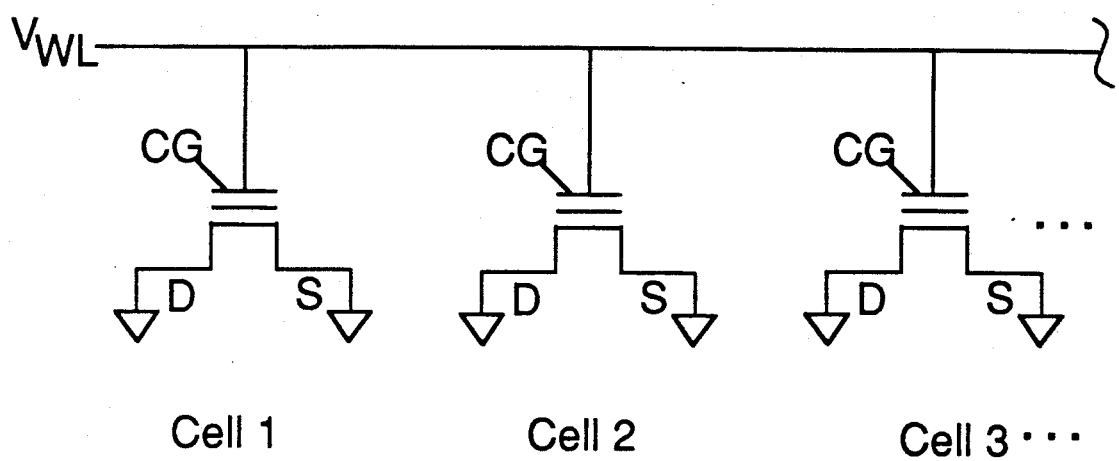
FIG. 7 includes an illustration of circuitry for repairing field-effect memory cells using gate disturb repair, wherein control gates are part of a word line in accordance with another alternate embodiment.
Figure 8:
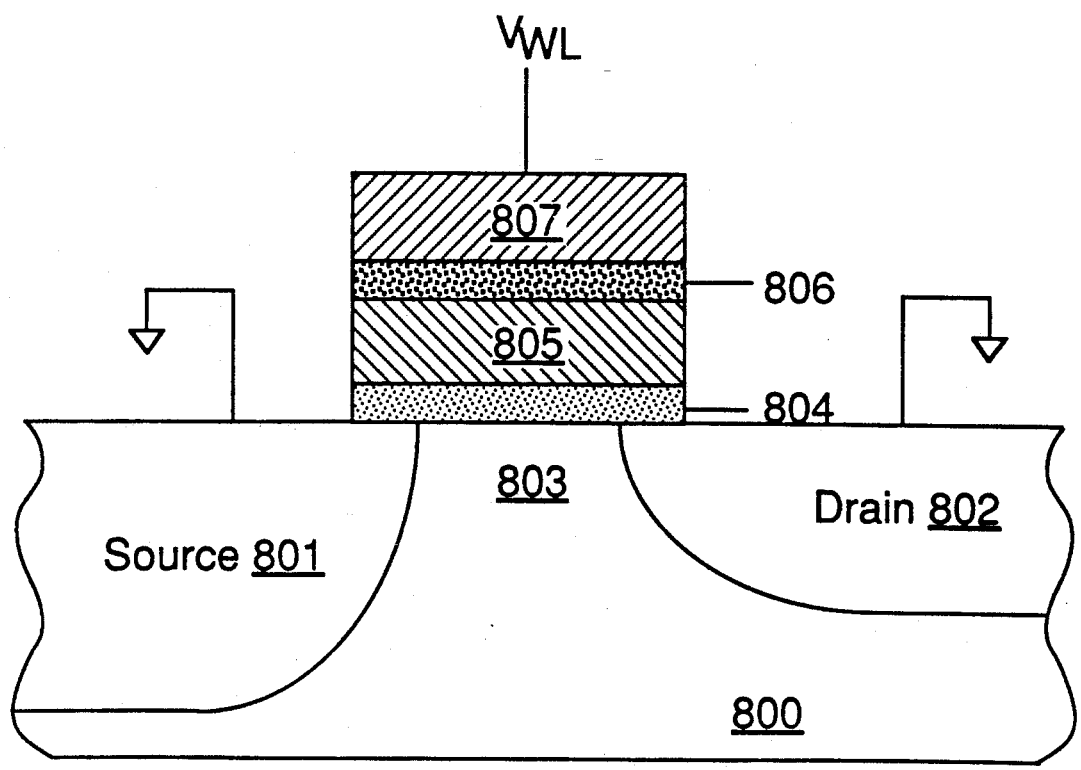
FIG. 8 includes an illustration of a cross sectional view of a cell connected to the word line of FIG. 7.

FIG. 7 includes an illustration of an alternate embodiment used to repair field-effect memory cells of an electrically erasable flash memory device. Each memory cell has a drain, a source, and a control gate. The control gates of the cells are part of a word line of the memory array. This alternate embodiment is called gate disturb repair. FIG. 7 illustrates the first three cells. The rest of the cells (not shown) are part of the word line similar to the first three cells shown in FIG. 7. FIG. 8 includes an illustration of one of the cells that appears in FIG. 7. The cell has a lightly p-type doped monocrystalline silicon layer 800. A source 801, which has a graded diffusion junction, and a drain 802 are heavily n-type doped regions within the monocrystalline silicon layer. A channel region 803 lies between the source 801 and the drain 802. A tunnel oxide 804, a floating gate 805, an intergate insulating layer 806, and a control gate 807 all lie over the channel region 803 and a portion of both the source 801 and the drain 802. The rest of the cells are substantially similar to the cell described.

The cells are programmed and erased using well known methods that typically form over-erased cells. The over-erased cells are repaired. During gate disturb repair, the sources and drains are grounded and the word line is taken to a predetermined voltage $V_{WL}$ that is typically about 12 V. $V_{WL}$ may range from about 10 V to about 15 V. Within each cell, electrons flow from the channel into an over-erased cell's floating gate by a Fowler-Nordheim tunneling process. Gate disturb repair is usually longer than drain disturb repair or source disturb repair because the tunneling process accumulates electrons within the floating gates at a slower rate than a hot electron injection process, such as drain disturb repair or source disturb repair.

The repair step is verified by monitoring drain current, source current, or VTCG. For drain current or source current verification, a cell's source and the word line are grounded, and the cell's drain is at a potential of about 1 V. If drain current for any cell that is part of the word line or the source current for any cell that is part of the word line is greater than about 0.5 nA, the repair step and verification step are repeated. For VTCG verification, if VTCG of any cell that is part of the word line is lower than about 0.5 V, the repair step and verification step are repeated. The repair and verification steps are completed after the verification criterion is met. The memory array is selectively reprogrammed using well known methods.

Other alternatives exist for the embodiments previously described. The repair step and the verification step may be applied to any number of cells at one time. The previously described embodiments can be used on one cell, but single cell devices typically do not have the prior art problems with over-erased cells, as described above. The embodiments may be used on any electrically erasable and electrically programmable memory device that includes a memory array having field-effect memory cells that may become over-erased during erasing.

Alternate embodiments exist for the verification step. The reprogramming sequence does not need to have the verification step, but the verification step is useful to determine whether the repair step reduced the number of over-erased cells. Another alternate embodiment may verify the repair during the repair step by monitoring the source current or the drain current during the repair step, itself. The actual drain current per cell or source current per cell used for the verification criteria, as well as, the conditions during verification may be changed. The verification criteria limit for drain current per cell or the source current per cell may be about 1.0 nA or even as large as about 10 nA. During verification, the sources may be at a potential of about 1 V and the drains are grounded, or the potential on the sources or the drains may be as high as about 5 V. Along similar lines, the VTCG verification criteria may be as high as about 3 V. The actual conditions used for verification are flexible, and one can modify the verification to one's needs. The verification procedure selected should confirm that a repaired cell is no longer an over-erased cell.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A method of reprogramming field-effect memory cells of a memory array of an electrically erasable and electrically programmable memory device, wherein each cell has a drain, a source, and a control gate, wherein the drains of the cells are electrically connected to a bit line of the memory array, comprising the steps of:

programming the cells;

erasing the cells;

repairing cells comprising over-erased cells by grounding the sources and the control gates and taking the bit line to a predetermined potential; and selectively programming the memory array.

2. The method of claim 1 further comprising the step of verifying the repair of the cells.

3. The method of claim 2, wherein the verification is done by measuring bit line current when the sources and the control gates are grounded and the bit line is at a potential of about 1 V, the repair step and the verification step being repeated if the bit line current is greater than about the product of the number of cells electrically connected to the bit line times 0.5 nA.

4. The method of claim 2, wherein the verification is done by measuring source current of each cell when the source and control gate are grounded and the bit line is at a potential of about 1 V, the repair step and the verification step being repeated if the source current of any cell on the bit line is greater than about 0.5 nA.

5. The method of claim 2, wherein the verification is done by measuring control gate threshold voltage of each cell, the repair step and the verification step being repeated if the control gate threshold voltage of any cell on the bit line is less than about 0.5 V.

6. A method of reprogramming field-effect memory cells of a memory array of an electrically erasable and electrically programmable memory device, wherein each cell has a drain, a source, and a control gate, wherein the sources of the cells are electrically connected to a source line of the memory array, comprising the steps of:
- programming the cells;
- erasing the cells;
- repairing cells comprising over-erased cells by grounding the drains and the control gates and taking the source line to a predetermined potential; and
- selectively programming the memory array.

7. The method of claim 6 further comprising the step of verifying the repair of the cells.

8. The method of claim 7, wherein the verification is done by measuring source line current when the source line and the control gates are grounded and the drains are at a potential of about 1 V, the repair step and the verification step being repeated if the source line current is greater than about the product of the number of cells electrically connected to the source line times 0.5 nA.

9. The method of claim 7, wherein the verification is done by measuring drain current of each cell when the source line and control gate are grounded and the drain is at a potential of about 1 V, the repair step and the verification step being repeated if the drain current of any cell on the source line is greater than about 0.5 nA.

10. The method of claim 7, wherein the verification is done by measuring control gate threshold voltage of each cell, the repair step and the verification step being repeated if the control gate threshold voltage of any cell on the source line is less than about 0.5 V.

11. A method of reprogramming field-effect memory cells of a memory array of an electrically erasable and electrically programmable memory device, wherein each cell has a drain, a source, and a control gate, wherein the control gates of the cells are part of a word line of the memory array, comprising the steps of:
- programming the cells;
- erasing the cells;
- repairing cells comprising over-erased cells by grounding the sources and the drains and taking the word line to a predetermined potential; and
- selectively programming the memory array.

12. The method of claim 11 further comprising the step of verifying the repair of the cells.

13. The method of claim 12, wherein the verification is done by measuring drain current of each cell when the source and the word line are grounded and the drain is at a potential of about 1 V, the repair step and the verification step being repeated if the drain current of any cell on the word line is greater than about 0.5 nA.

14. The method of claim 12, wherein the verification is done by measuring source current of each cell when the source and the word line are grounded and the drain is at a potential of about 1 V, the repair step and the verification step being repeated if the source current of any cell on the word line is greater than about 0.5 nA.

15. The method of claim 12, wherein the verification is done by measuring control gate threshold voltage of each cell, the repair step and the verification step being repeated if the control gate threshold voltage of any cell on the word line is less than about 0.5 V.

* * * * *